US011473790B2

United States Patent
Murakami

(10) Patent No.: US 11,473,790 B2
(45) Date of Patent: Oct. 18, 2022

(54) OUTDOOR UNIT OF AIR-CONDITIONING APPARATUS

(71) Applicant: Mitsubishi Electric Corporation, Tokyo (JP)

(72) Inventor: Hirokazu Murakami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 116 days.

(21) Appl. No.: 16/976,835

(22) PCT Filed: Apr. 25, 2018

(86) PCT No.: PCT/JP2018/016809
§ 371 (c)(1),
(2) Date: Aug. 31, 2020

(87) PCT Pub. No.: WO2019/207683
PCT Pub. Date: Oct. 31, 2019

(65) Prior Publication Data
US 2021/0003295 A1 Jan. 7, 2021

(51) Int. Cl.
*F25D 23/12* (2006.01)
*F24F 1/56* (2011.01)

(52) U.S. Cl.
CPC .................. *F24F 1/56* (2013.01)

(58) Field of Classification Search
CPC ....... F16B 5/10; F24F 1/56; F24F 1/22; F24F 1/34; F24F 1/58; F24F 11/89; F24F 13/20; H05K 5/03
See application file for complete search history.

(56) References Cited

U.S. PATENT DOCUMENTS

2014/0132127 A1* 5/2014 Kawaguchi ............... F24F 1/56
312/100
2018/0313586 A1* 11/2018 Nishida ................... F25B 30/02

FOREIGN PATENT DOCUMENTS

| JP | H07-260208 A | 10/1995 |
|----|--------------|---------|
| JP | H08-086474 A | 4/1996 |
| JP | 2005-249246 A | 9/2005 |

(Continued)

OTHER PUBLICATIONS

The pdf file is translation of foreign reference JP2007212104A (Year: 2007).*

(Continued)

Primary Examiner — Henry T Crenshaw
Assistant Examiner — Kamran Tavakoldavani
(74) Attorney, Agent, or Firm — Posz Law Group, PLC

(57) ABSTRACT

An outer casing of an outdoor unit of an air-conditioning apparatus includes: a body in which a first opening is formed to be continuous in a side portion and a back portion; and a first panel that covers the first opening and whose cross section has an L shape. The first panel includes: a side panel that covers a part formed in the side portion of the first opening; a back panel that covers a part formed in the back portion of the first opening; and a plurality of claw portions. One of the plurality of claw portions is a first claw portion having a plate-like shape and protruding upward from an upper end portion of the back panel. The back portion of the body includes: a first plate having a lower end portion in which a cutout is formed; and a second plate disposed forward of the first plate.

9 Claims, 6 Drawing Sheets

(56) References Cited

FOREIGN PATENT DOCUMENTS

| | | | |
|---|---|---|---|
| JP | 2006-242542 A | | 9/2006 |
| JP | 2007-212104 A | | 8/2007 |
| JP | 2007212104 A | * | 8/2007 |
| JP | 2009-144956 A | | 7/2009 |
| JP | 2009-210153 A | | 9/2009 |

OTHER PUBLICATIONS

Attached pdf is translation of foreign reference JP 2007212104A (Year: 2007).*
Extended European Search Report dated Mar. 15, 2021, issued in corresponding European Patent Application No. 18916262.1.
International Search Report of the International Searching Authority dated Jul. 17, 2018 for the corresponding International application No. PCT/JP2018/016809 (and English translation).

* cited by examiner

OUTDOOR UNIT OF AIR-CONDITIONING APPARATUS

CROSS REFERENCE TO RELATED APPLICATION

This application is a U.S. national stage application of International Application No. PCT/JP2018/016809, filed on Apr. 25, 2018, the contents of which are incorporated herein by reference.

TECHNICAL FIELD

The present disclosure relates to an outdoor unit of an air-conditioning apparatus. The outdoor unit includes an outer casing in which an opening used during installation or maintenance, for example, is formed.

BACKGROUND

An opening used during installation or maintenance, for example, is formed in an outer casing of a related-art outdoor unit of an air-conditioning apparatus. The opening is covered with a panel when the opening is not used. That is, the outer casing includes a body in which the opening is formed and a panel that covers the opening. The panel is, for example, fixed to the body by screwing. A compressor, an outdoor heat exchanger, and other components form a refrigerant passage in the outdoor unit. An indoor heat exchanger and other components form a refrigerant passage in an indoor unit. For example, when the refrigerant passage in the outdoor unit and the refrigerant passage in the indoor unit are connected by refrigerant pipes, an operator uncovers the opening in the outer casing of the outdoor unit by detaching the panel. The operator then inserts their hands into the outer casing from the opening and connects the refrigerant pipes to the refrigerant passage in the outdoor unit.

In a related-art outdoor unit in which an opening used during installation or maintenance, for example, is formed, an outdoor unit in which an opening is formed to be continuous in a side portion and a back portion of an outer casing is known. The following problem arises that in such an outdoor unit in which an opening is formed in an outer casing and that has a configuration in which a panel is screwed and fixed to a back portion of a body. That is, such an outdoor unit may be disposed in a state in which, for example, a wall surface is positioned in the vicinity of the back portion thereof. In such a case, it is not possible to form a sufficient workspace behind the back portion of the outdoor unit for attaching and detaching a screw. Thus, in such an outdoor unit having a configuration in which a panel is screwed and fixed to a back portion of a body, it is difficult to attach and detach the panel, in other words, in order to cover and uncover an opening.

In addition, another related-art outdoor unit is also proposed in view of such a problem. In the related-art outdoor unit, openings in which hooked claw portions disposed on a panel are inserted are formed in a body, the claw portions of the panel are hooked on the respective edges of the openings of the body, and the panel is fixed to a back portion of the body (for example, see Patent Literature 1). The panel is screwed and fixed to a side portion of the body after being fixed to the back portion of the body.

PATENT LITERATURE

Patent Literature 1: Japanese Unexamined Patent Application Publication No. 7-260208

As described above, in the related-art outdoor unit, the panel is fixed to the back portion of the body with the hooked claw portions. In such a configuration in which a panel is fixed to a back portion of a body with hooked claw portions, the degree of unsteadiness of the panel relative to the body is large. For this reason, in the related-art outdoor unit, the amount of tilt of the panel relative to the body is large after the panel is fixed to the back portion of the body and before the panel is fixed to the side portion of the body. As a result, in the related-art outdoor unit, when an operator tries to fix the panel to the side portion of the body with a screw, the amount of misalignment between a screw hole formed in the panel and a female screw formed in the body is increased. Thus, in the related-art outdoor unit, when an operator tries to fix the panel to the side portion of the body with a screw, a problem arises that the alignment of the screw hole formed in the panel with the female screw formed in the body is complex and that attaching the panel to the body is troublesome.

SUMMARY

The present disclosure has been made to solve the above problem, and an object thereof is to provide an outdoor unit of an air-conditioning apparatus. In the outdoor unit, an opening is formed such that it is continuous in a side portion and a back portion of an outer casing, and a panel is easier to attach and detach than that in the related art.

An outdoor unit of an air-conditioning apparatus according to an embodiment of the present disclosure includes an outer casing having a back portion and a side portion. The outer casing includes: a body in which a first opening is formed such that it is continuous in the side portion and the back portion; and a first panel that covers the first opening and whose cross section has an L shape. The first panel includes: a side panel that covers a part formed in the side portion of the first opening; a back panel that covers a part formed in the back portion of the first opening; and a plurality of claw portions. One of the plurality of claw portions is a first claw portion that has a plate-like shape and that protrudes upward from an upper end portion of the back panel. The back portion of the body includes: a first plate having a lower end portion in which a cutout is formed; and a second plate disposed forward of the first plate with a predetermined distance between the first plate and the second plate. When the first claw portion is inserted into the cutout, and the first panel is moved in a direction in which the side panel approaches the side portion, the first claw portion is disposed between the first plate and the second plate.

In the outdoor unit of an air-conditioning apparatus according to the embodiment of the present disclosure, the back panel of the first panel is fixed to the back portion of the body with the plurality of claw portions including the first claw portion. Thus, in the outdoor unit of an air-conditioning apparatus according to the embodiment of the present disclosure, even if there is no sufficient workspace behind the back portion of the outdoor unit, the back panel of the first panel can be easily attached to and detached from the back portion of the body.

In addition, in the outdoor unit of an air-conditioning apparatus according to the embodiment of the present disclosure, in the state in which the back panel of the first panel is fixed to the back portion of the body, the first claw portion having a plate-like shape is inserted between the first plate and the second plate. In such a configuration in which the back panel of the first panel is fixed as described above, the spaces between the first claw portion having a plate-like shape and the first plate and between the first claw portion having a plate-like shape and the second plate can be small. Thus, in the outdoor unit of an air-conditioning apparatus according to the embodiment of the present disclosure, in the state in which the back panel of the first panel is fixed to the back portion of the body, the amount of tilt of the first panel relative to the body can be smaller than the amount of tilt of a panel relative to a body in a related-art outdoor unit. Thus, for example, when the side panel of the first panel is fixed to the side portion of the body with a screw, the amount of misalignment between a screw hole formed in the side panel of the first panel and a female screw formed in the side portion of the body is small. That is, the alignment of the screw hole formed in the side panel of the first panel with the female screw formed in the side portion of the body is easy. As a result, in the outdoor unit of an air-conditioning apparatus according to the embodiment of the present disclosure, the operation of attaching a panel to a body is easier than that of the related art.

DETAILED DESCRIPTION

Embodiment

Figure 1:
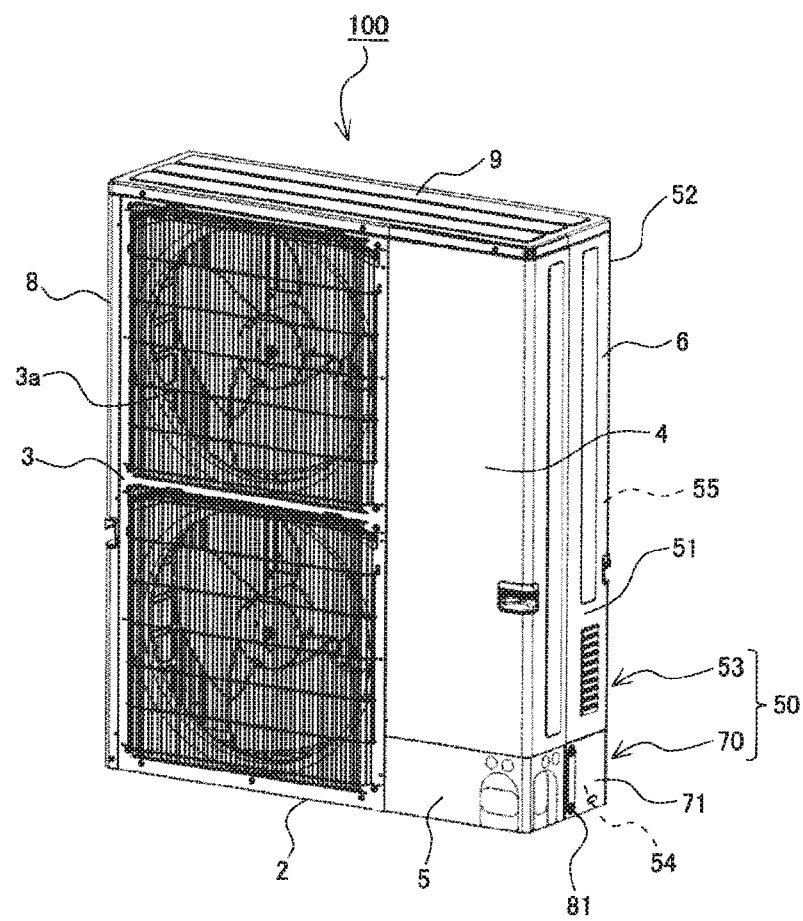
FIG. 1 is a perspective view of an outdoor unit of an air-conditioning apparatus according to Embodiment of the present disclosure when viewed from its front side.

An outdoor unit 100 of an air-conditioning apparatus according to Embodiment of the present disclosure will be described below with reference to the drawings. In the drawings below, when a component hidden by another component is assigned a reference sign with a leader line, the leader line pointing to the hidden component is a dashed line.

Figure 2:
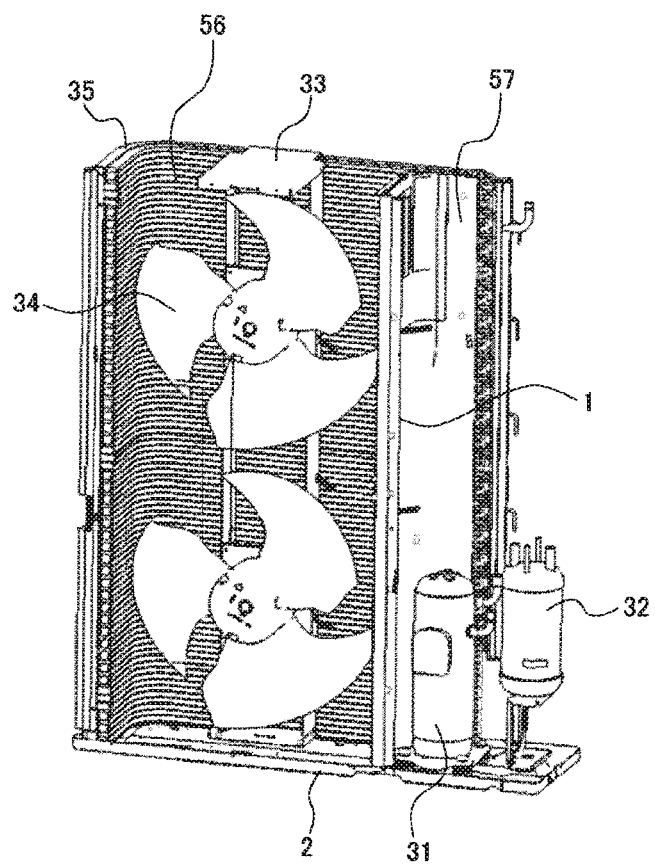
FIG. 2 is a perspective view of an internal structure of the outdoor unit of the air-conditioning apparatus according to Embodiment of the present disclosure when viewed from its front side.
Figure 3:
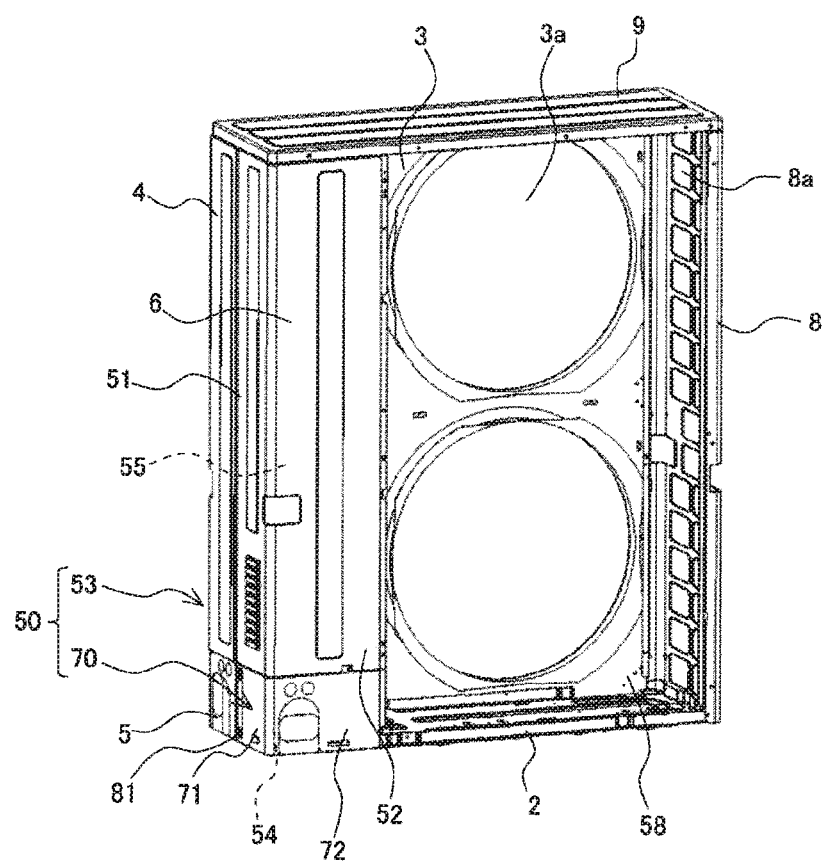
FIG. 3 is a perspective view of an outer casing of the outdoor unit of the air-conditioning apparatus according to Embodiment of the present disclosure when viewed from its back side.

FIG. 1 is a perspective view of an outdoor unit of an air-conditioning apparatus according to Embodiment of the present disclosure when viewed from its front side. FIG. 2 is a perspective view of an internal structure of the outdoor unit of the air-conditioning apparatus according to Embodiment of the present disclosure when viewed from its front side. FIG. 3 is a perspective view of an outer casing of the outdoor unit of the air-conditioning apparatus according to Embodiment of the present disclosure when viewed from its back side.

The outdoor unit 100 of the air-conditioning apparatus according to Embodiment includes an outer casing 50, which has a side portion 51 and a back portion 52. The outer casing 50 has a substantially cuboid shape. The outer casing 50 includes a body 53 and a first panel 70. The body 53 has a substantially cuboid shape. A first opening 54 is formed in the body 53 to be continuous in the side portion 51 and the back portion 52. As described below, the body 53 is partitioned into a fan compartment 56 and a machine compartment 57. Fans 34 and an outdoor heat exchanger 35 are disposed in the fan compartment 56. A compressor 31 is disposed in the machine compartment 57. The first opening 54 is formed in the machine compartment 57.

The first panel 70 is a component that covers the first opening 54 and is attached to the body 53 such that it can be detached therefrom. Specifically, the first panel 70 includes a side panel 71 and a back panel 72. The side panel 71 covers the part formed in the side portion 51 of the first opening 54. The back panel 72 covers the part formed in the back portion 52 of the first opening 54. The first panel 70 is shaped such that an end portion of the side panel 71 and an end portion of the back panel 72 are continuous with each other and a cross section of the first panel 70 has an L shape.

The components of the body 53 are not particularly limited as long as the first opening 54 is formed in the body 53. In Embodiment, the body 53 is composed of a bottom plate 2, a front panel 3, a service panel 4, a lower front panel 5, a second panel 6, a left side panel 8, and a top panel 9.

The bottom plate 2 is a component forming the bottom of the body 53. The front panel 3, together with the service panel 4, is a component forming the front of the body 53. Specifically, the service panel 4 forms the part closer to the side portion 51 of the front of the body 53. The front panel 3 forms the part closer to the side portion opposite to the side portion 51 of the front of the body 53. In addition, the front panel 3 forms the front of the fan compartment 56, in which the fans 34 and the outdoor heat exchanger 35 are disposed. Thus, air outlets 3a are formed in the front panel 3 to face the respective fans 34. The outdoor unit 100 according to Embodiment includes two fans 34. Thus, two air outlets 3a are formed in the front panel 3.

The service panel 4 and the lower front panel 5 are components each forming a part of the front of the body 53 and a forward side of the side portion 51 of the body 53. The service panel 4 forms the upper part, and the lower front panel 5 forms the lower part. The second panel 6 is a component forming, above the first opening 54, the back side of the side portion 51 of the body 53 and a part of the back portion 52 of the body 53.

The left side panel 8 is a component forming the side portion opposite to the side portion 51 in the body 53. The side portion opposite to the side portion 51 in the body 53 is a side portion of the fan compartment 56, in which the fans 34 and the outdoor heat exchanger 35 are disposed. Thus, air inlets 8a are formed in the left side panel 8 to face the outdoor heat exchanger 35. The top panel 9 is a component forming the top of the body 53.

In the body 53 formed in such a manner, an opening surrounded by the bottom plate 2, the first panel 70, the second panel 6, and the left side panel 8 is formed in the back portion 52 of the body 53. The opening is an air inlet 58 and is positioned to face the outdoor heat exchanger 35.

In the body 53 according to Embodiment, the second panel 6 is, for example, screwed and attached to the components on the periphery of the second panel 6 such that it can be detached therefrom. That is, a second opening 55 is formed in the body 53 to be continuous in the side portion 51 and the back portion 52 and such that the lower end of the second opening 55 is continuous with the upper end of the first opening 54. The second opening 55 is covered with the second panel 6.

As illustrated in FIG. 2, the body 53 is partitioned into the fan compartment 56 and the machine compartment 57 with a partition plate 1 and the end portion closer to the side portion 51 of the outdoor heat exchanger 35.

The fans 34 and the outdoor heat exchanger 35 are disposed in the fan compartment 56. Specifically, the fans 34 each include, for example, a propeller-type impeller and a motor that drives the impeller to rotate. A motor support 33 is disposed on the bottom plate 2 of the body 53. Each motor of the fans 34 is fixed to the motor support 33. In this case, the fans 34 are disposed to face the respective air outlets 3a. The outdoor heat exchanger 35 is disposed in the fan compartment 56 to face the air inlets of the body 53. As described above, in the body 53 according to Embodiment, the air inlets 8a are formed in the side portion opposite to the side portion 51 in the body 53, and the air inlet 58 is formed in the back portion 52. Thus, the outdoor heat exchanger 35 according to Embodiment has an L shape in plan view.

The compressor 31, which is a component of a refrigerant circuit, is disposed in the machine compartment 57. In addition, a refrigerant tank 32, in which surplus refrigerant in the refrigerant circuit is stored, is disposed in the machine compartment 57 according to Embodiment. In addition, an expansion valve (not illustrated) that expands the refrigerant flowing in the refrigerant circuit is disposed in the machine compartment 57 according to Embodiment. The compressor 31, the heat-transfer tubes of the outdoor heat exchanger 35, the expansion valve, and the refrigerant tank 32 are connected in the machine compartment 57 by refrigerant pipes (not illustrated). That is, in the outdoor unit 100, the compressor 31, the outdoor heat exchanger 35, and other components are connected by the refrigerant pipes and form a refrigerant passage that is a part of the refrigerant circuit.

Also in an indoor unit (not illustrated) connected to the outdoor unit 100, an indoor heat exchanger and other components are connected by refrigerant pipes and form a refrigerant passage that is a part of the refrigerant circuit. The refrigerant passage in the outdoor unit 100 and the refrigerant passage in the indoor unit are connected by refrigerant pipes, and the refrigerant circuit is completed. When the refrigerant discharged from the compressor 31 circulates in the refrigerant circuit, the refrigerant receives heat in the outdoor heat exchanger 35 and transfers heat in the indoor heat exchanger to perform a heating operation. On the other hand, when the refrigerant discharged from the compressor 31 circulates in the refrigerant circuit, the refrigerant receives heat in the indoor heat exchanger and transfers heat in the outdoor heat exchanger 35 to perform a cooling operation.

In addition, an electric component box (not illustrated) is disposed in the machine compartment 57. The electric component box houses, for example, electric components that supply electricity to the compressor 31 and other components. The electric component box is disposed, for example, at an upper part in the machine compartment 57.

The first opening 54 formed in the body 53 is used, for example, during installation or maintenance of the outdoor unit 100. For example, when the refrigerant passage in the outdoor unit and the refrigerant passage in the indoor unit are connected by refrigerant pipes, an operator uncovers the first opening 54 by detaching the first panel 70. The operator then inserts their hands into the machine compartment 57 of the body 53 from the first opening 54 and connects the refrigerant pipes to the refrigerant passage in the outdoor unit 100.

The outdoor unit 100 may be disposed in a state in which, for example, a wall surface is positioned in the vicinity of the back portion 52. For example, when the back panel 72 of the first panel 70 is fixed to the body 53 with a screw, and a wall surface is positioned in the vicinity of the back portion 52, it is not possible to form a sufficient workspace behind the back portion 52 of the outdoor unit 100 for attaching and detaching the screw. To address such a problem, in the outdoor unit 100 according to Embodiment, the back panel 72 is fixed to the body 53 in the configuration described below, whereby the first panel 70 is easy to attach and detach.

Figure 4:
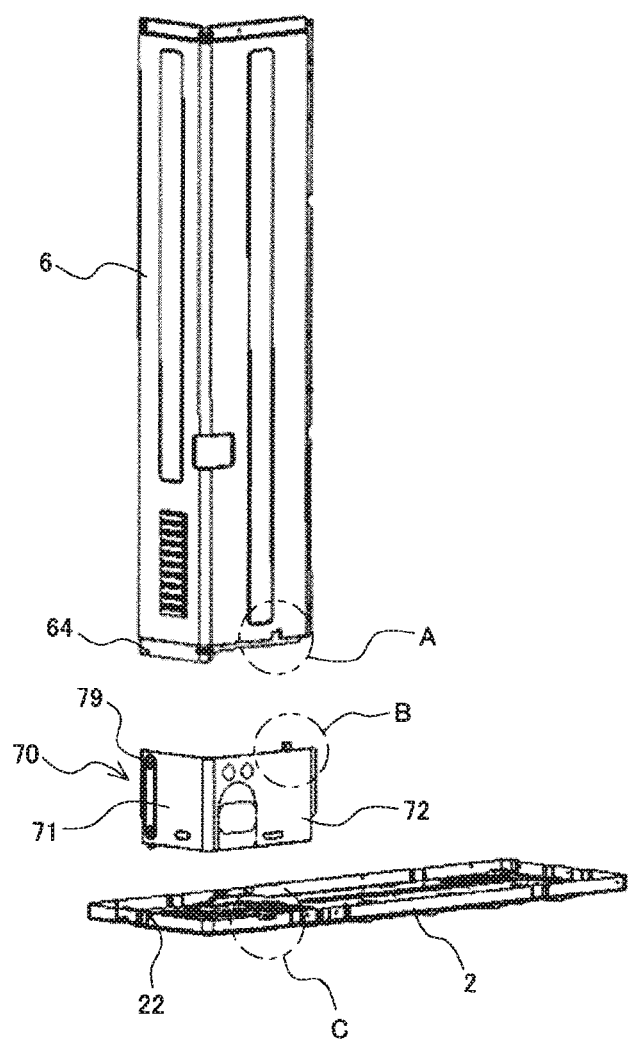
FIG. 4 is an exploded perspective view of a first panel, a second panel, and a bottom plate of the outdoor unit of the air-conditioning apparatus according to Embodiment of the present disclosure when viewed from their back sides.
Figure 5:
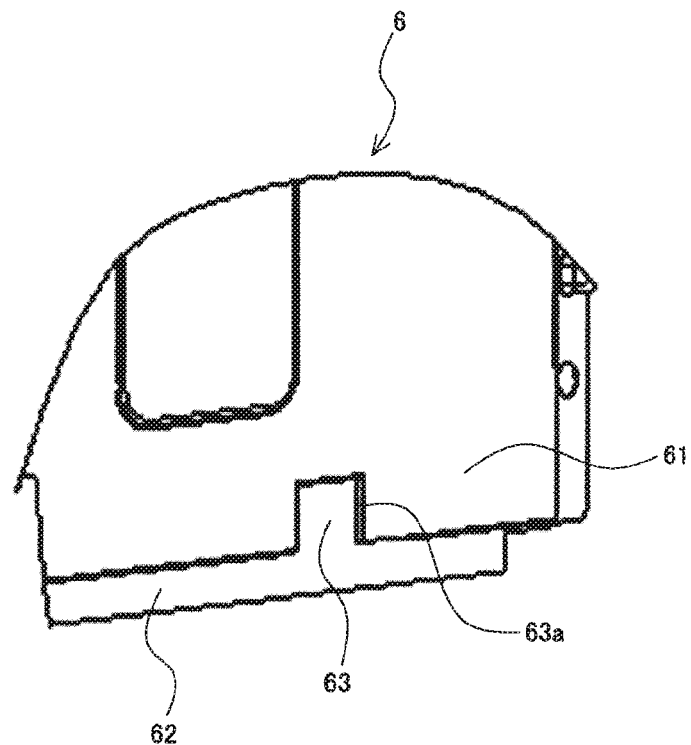
FIG. 5 is an enlarged view of a section A in FIG. 4.
Figure 6:
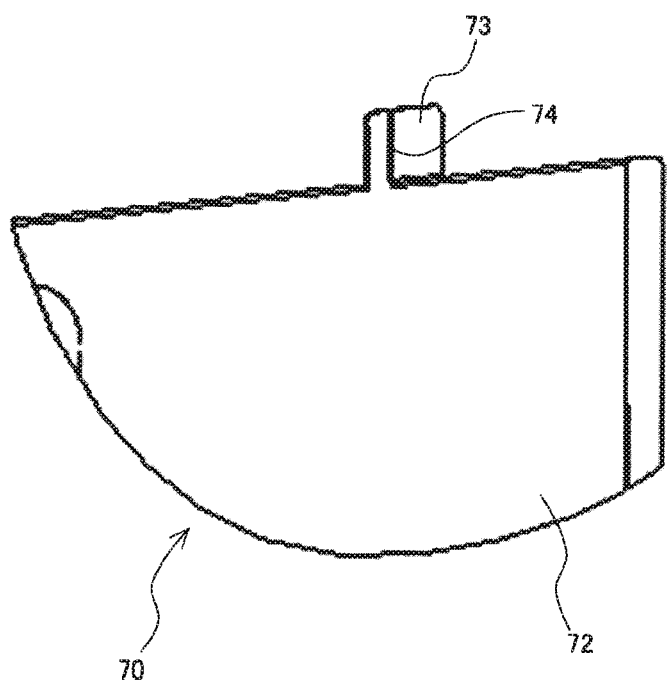
FIG. 6 is an enlarged view of a section B in FIG. 4.
Figure 7:
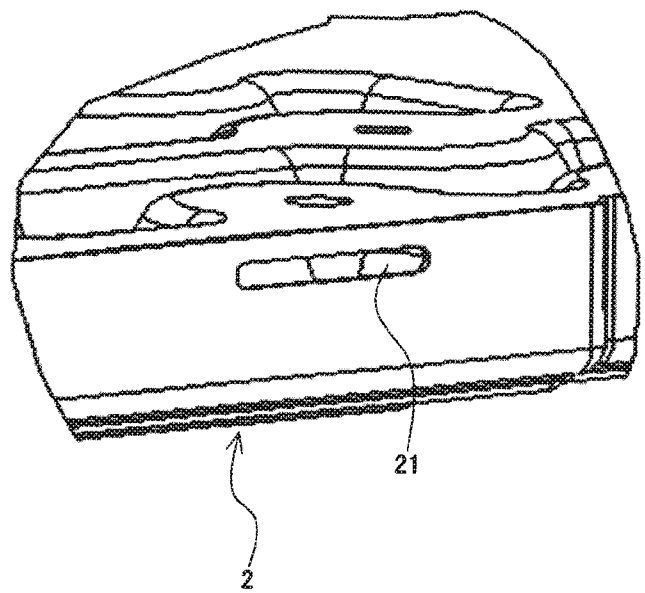
FIG. 7 is an enlarged view of a section C in FIG. 4.
Figure 8:
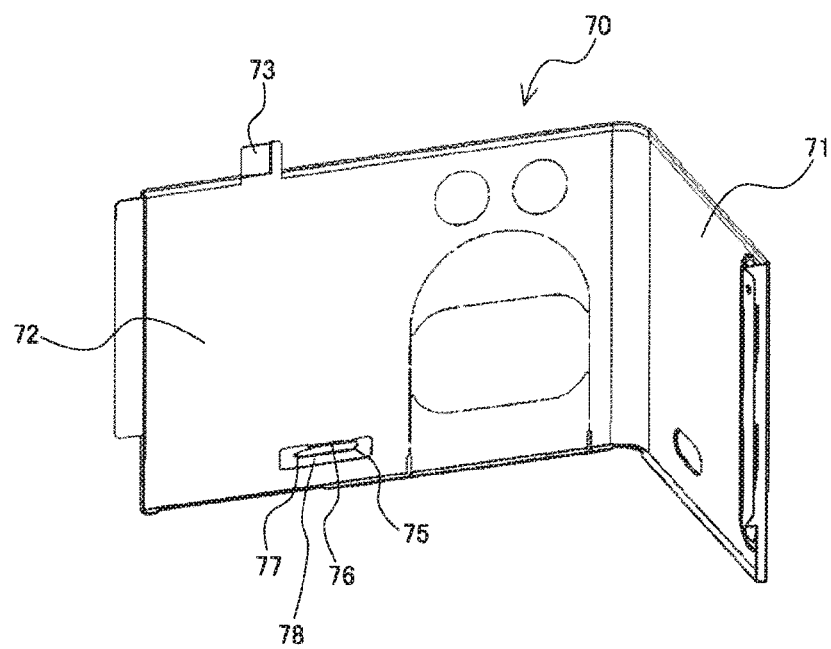
FIG. 8 is a perspective view of the first panel of the outdoor unit of the air-conditioning apparatus according to Embodiment of the present disclosure when viewed from its front side.

FIG. 4 is an exploded perspective view of a first panel, a second panel, and a bottom plate of the outdoor unit of the air-conditioning apparatus according to Embodiment of the present disclosure when viewed from their back sides. FIG. 5 is an enlarged view of a section A in FIG. 4. FIG. 6 is an enlarged view of a section B in FIG. 4. FIG. 7 is an enlarged view of a section C in FIG. 4. FIG. 8 is a perspective view of the first panel of the outdoor unit of the air-conditioning apparatus according to Embodiment of the present disclosure when viewed from its front side. In other words, FIG. 8 is a perspective view of the first panel 70 from a viewpoint opposite to that in FIGS. 4 and 6.

The first panel 70 includes a plurality of claw portions including a first claw portion 73. In Embodiment, the first panel 70 includes the first claw portion 73 and a second claw portion 75.

The first claw portion 73 is a claw portion having a plate-like shape and protruding upward from an upper end portion of the back panel 72. In Embodiment, the first claw portion 73 is shaped into a rectangle. In addition, a stepped portion 74, which extends in an up-down direction, is disposed in a middle of the first claw portion 73 in a left-right direction. When the first claw portion 73 is viewed from its back side, the stepped portion 74 protrudes backward of the part farther than the stepped portion 74 from the side panel 71. In FIG. 6, the part farther than the stepped portion 74 from the side panel 71 is the part on the right of the stepped portion 74 in the figure.

The second claw portion 75 is disposed at the front of the back panel 72. That is, the second claw portion 75 protrudes in a direction different from the direction in which the first claw portion 73 protrudes. The second claw portion 75 protrudes to the inside of the body 53. In Embodiment, the second claw portion 75 is disposed in the vicinity of the lower end of the back panel 72. The second claw portion 75 includes a base 76 and a protrusion 77. The base 76 protrudes forward from the front of the back panel 72. The protrusion 77 protrudes from the base 76 away from the side panel 71.

In addition, an opening 78, which is a fourth opening, is formed in the back panel 72 of the first panel 70. The opening 78 is formed to face an opening 21, which is described below, in a state in which the first panel 70 is attached to the body 53. In Embodiment, the second claw portion 75 is formed by cutting and raising a part of the back panel 72. The opening 78 is formed by cutting and removing the peripheral portion of the second claw portion 75 in the cutting and raising of a part of the back panel 72.

The first claw portion 73 described above is fixed to a part forming the back portion 52 of the second panel 6. Specifically, the part forming the back portion 52 of the second panel 6 includes a first plate 61 and a second plate 62. A cutout 63 is formed in a lower end portion of the first plate 61. The first claw portion 73 is inserted into the cutout 63. Thus, the cutout 63 is formed to be slightly larger than the first claw portion 73. The second plate 62 is disposed forward of the first plate 61 with a predetermined distance between the first plate 61 and the second plate 62. The predetermined distance is, for example, a distance slightly larger than the thickness of the plate component forming the first claw portion 73.

To fix the first claw portion 73 to the part forming the back portion 52 of the second panel 6, first, the first claw portion 73 is inserted into the cutout 63 from the back side. In this case, for example, the first claw portion 73 is inserted into a position at which the first claw portion 73 is brought into contact with the second plate 62. Then, the first panel 70 is moved in a direction in which the side panel 71 approaches a part forming the side portion 51 of the second panel 6. Moving the first panel 70 in such a manner results in the first claw portion 73 being disposed between the first plate 61 and the second plate 62. That is, the first claw portion 73 is inserted between the first plate 61 and the second plate 62 with small spaces provided between the first claw portion 73 and the first plate 61 and between the first claw portion 73 and the second plate 62. As a result, the first claw portion 73 is fixed to the part forming the back portion 52 of the second panel 6.

As described above, the first claw portion 73 according to Embodiment includes the stepped portion 74. Thus, when the first panel 70 is moved as described above, the stepped portion 74 of the first claw portion 73 is brought into contact with an edge 63a of the cutout 63, and the first panel 70 stops. As a result, the stepped portion 74 disposed on the first claw portion 73 can prevent the first claw portion 73 from being inserted excessively deeply between the first plate 61 and the second plate 62.

The second claw portion 75 described above is fixed to a back portion of the bottom plate 2. Specifically, the opening 21, which is a third opening, is formed in the back portion of the bottom plate 2. The second claw portion 75 is inserted into the opening 21. Thus, the opening 21 is formed to be larger than the second claw portion 75.

To fix the second claw portion 75 to the back portion of the bottom plate 2, first, the second claw portion 75 is inserted into the opening 21 from the back side. Then, the first panel 70 is moved in the direction in which the side panel 71 approaches the part forming the side portion 51 of the second panel 6. As a result, the protrusion 77 of the second claw portion 75 is hooked on an edge of the opening 21, and the second claw portion 75 is fixed to the back portion of the bottom plate 2. In addition, the opening 78 in the first panel 70 faces the opening 21 in the state in which the second claw portion 75 is fixed to the back portion of the bottom plate 2.

As illustrated in FIGS. 1 and 3, the side panel 71 of the first panel 70 is fixed to the body 53 with a male screw 81. Specifically, as illustrated in FIG. 4, a hole 79, into which the male screw 81 is inserted, is formed in the side panel 71 of the first panel 70. In Embodiment, the side panel 71 of the first panel 70 is fixed with two male screws 81. Thus, two holes 79 are each formed in a corresponding one of the upper part and the lower part of the side panel 71. A female screw 64, into which the male screw 81 inserted into the hole 79 in the upper part is screwed, is formed in the second panel 6. A female screw 22, into which the male screw 81 inserted into the hole 79 in the lower part is screwed, is formed in the bottom plate 2. The male screw 81 inserted into the hole 79 in the upper part is screwed into the female screw 64, and the male screw 81 inserted into the hole 79 in the lower part is screwed into the female screw 22. As a result, the side panel 71 of the first panel 70 is fixed to the second panel 6 and the bottom plate 2.

Next, the operations of detaching and attaching the first panel 70 are described.

To detach the first panel 70 from the body 53, first, the male screw 81 is unscrewed from the female screw 64 in the second panel 6, and the male screw 81 is unscrewed from the female screw 22 in the bottom plate 2. As a result, the side panel 71 of the first panel 70 is unfixed. Then, the first panel 70 is moved in the direction in which the side panel 71 moves away from the part forming the side portion 51 of the second panel 6. Then, after the first panel 70 is moved to a position at which the whole first claw portion 73 faces the cutout 63 in the second panel 6 and at which the whole second claw portion 75 faces the opening 21 in the bottom plate 2, the first panel 70 is moved backward. Then, the first claw portion 73 is removed through the cutout 63, and the second claw portion 75 is removed through the opening 21. As a result, it is possible to detach the first panel 70 from the body 53.

To attach the first panel 70 to the body 53, first, the first claw portion 73 is inserted into the cutout 63 from the back side, and the second claw portion 75 is inserted into the opening 21 from the back side. Then, the first panel 70 is moved in the direction in which the side panel 71 approaches the part forming the side portion 51 of the second panel 6. Then, the side panel 71 is brought into contact with the part forming the side portion 51 of the second panel 6. In this state, the first claw portion 73 is disposed between the first plate 61 and the second plate 62, and the first claw portion 73 is inserted between the first plate 61 and the second plate 62 with small spaces between the first claw portion 73 and the first plate 61 and between the first claw portion 73 and the second plate 62. That is, the first claw portion 73 is fixed to the part forming the back portion 52 of the second panel 6. In addition, in this state, the protrusion 77 of the second claw portion 75 is hooked on the edge of the opening 21, and the second claw portion 75 is fixed to the back portion of the bottom plate 2. Finally, the male screw 81 inserted into the hole 79 in the upper part is screwed into the female screw 64, and the male screw 81 inserted into the hole 79 in the lower part is screwed into the female screw 22. As a result, the side panel 71 of the first panel 70 is fixed to the second panel 6 and the bottom plate 2. That is, the first panel 70 is attached to the body 53.

In such a manner, the first panel 70 according to Embodiment is fixed to the back portion 52 of the body 53 with the first claw portion 73 and the second claw portion 75. Thus, in the outdoor unit 100 according to Embodiment, even if there is no sufficient workspace behind the back portion 52 of the outdoor unit 100, the back panel 72 of the first panel 70 can be easily attached to and detached from the back portion 52 of the body 53.

In the outdoor unit 100 according to Embodiment, in the state in which the back panel 72 of the first panel 70 is fixed to the back portion 52 of the body 53, the first claw portion 73 having a plate-like shape is inserted between the first plate 61 and the second plate 62. In such a configuration in which the back panel 72 of the first panel 70 is fixed as described above, the spaces between the first claw portion 73 having a plate-like shape and the first plate 61 and between the first claw portion 73 having a plate-like shape and the second plate 62 can be small. Thus, in the outdoor unit 100 according to Embodiment, in the state in which the back panel 72 of the first panel 70 is fixed to the back portion 52 of the body 53, the amount of tilt of the first panel 70 relative to the body 53 can be smaller than the amount of tilt of a panel relative to a body in an existing outdoor unit in which the panel is fixed to a back portion of the body with hooked claw portions. Thus, in the outdoor unit 100 according to Embodiment, the amounts of misalignment between the holes 79, which are formed in the side panel 71 of the first panel 70 and into which the male screws 81 are inserted, and the respective female screws 22 and 64, which are formed in the side portion 51 of the body 53, are small. Thus, when the side panel 71 is fixed to the side portion 51 of the body 53 with the male screws 81, the alignment of the holes 79, which are formed in the side panel 71 and into which the male screws 81 are inserted, with the respective female screws 22 and 64, which are formed in the side portion 51 of the body 53, is facilitated. As a result, in the outdoor unit 100 according to Embodiment, attaching the first panel 70 to the body 53 is easier than attaching the panel to the body in the existing outdoor unit in which the panel is fixed to the back portion of the body with the hooked claw portions. In other words, the outdoor unit 100 according to Embodiment provides more improved ease of maintenance than that of the related-art outdoor unit in which the panel is fixed to the back portion of the body with the hooked claw portions, and thus the time for installation can be reduced.

In addition, since the first claw portion 73 according to Embodiment includes the stepped portion 74, it is possible to prevent the first claw portion 73 from being inserted excessively deeply between the first plate 61 and the second plate 62. Thus, the amounts of misalignment between the holes 79, which are formed in the side panel 71 of the first panel 70 and into which the male screws 81 are inserted, and the respective female screws 22 and 64, which are formed in the side portion 51 of the body 53, can be smaller. As a result, the first claw portion 73 including the stepped portion 74 enables the operation of attaching the first panel 70 to the body 53 to be easier.

The assembly of the outdoor unit 100 also includes the operation of attaching the first panel 70 to the body 53. Thus, the effect of facilitating the operation of attaching the first panel 70 to the body 53 is also exerted during the assembly of the outdoor unit 100.

In addition, the body 53 according to Embodiment includes the second panel 6, which covers the second opening 55. Thus, in the outdoor unit 100 according to Embodiment, if it is difficult for an operator to insert their hands into the body 53 from the first opening 54 to perform an operation in the body 53, the operator can perform an operation in the body 53 by detaching the second panel 6 and inserting their hands into the body 53 from the second opening 55. In the outdoor unit 100 according to Embodiment, the first claw portion 73 having a plate-like shape of the first panel 70 is inserted between the first plate 61 and the second plate 62 of the second panel 6. Thus, an operator can detach the second panel 6, without detaching the first panel 70, by lifting up the second panel 6 and pulling out the first claw portion 73 between the first plate 61 and the second plate 62. As a result, the outdoor unit 100 according to Embodiment can provide more improved ease of maintenance.

In addition, in the outdoor unit 100 according to Embodiment, the opening 78, which faces the opening 21 in the bottom plate 2, is formed in the first panel 70. Thus, when water collects in the outer casing 50, the water in the outer casing 50 can be discharged to the outside through the opening 21 in the bottom plate 2 and the opening 78 in the first panel 70.

As described above, the outdoor unit 100 of the air-conditioning apparatus according to Embodiment includes the outer casing 50 having the back portion 52 and the side portion 51. The outer casing 50 includes the body 53, in which the first opening 54 is formed to be continuous in the side portion 51 and the back portion 52, and the first panel 70, which covers the first opening 54 and whose cross section has an L shape. The first panel 70 includes the side panel 71, which covers the part formed in the side portion 51 of the first opening 54, the back panel 72, which covers the part formed in the back portion 52 of the first opening 54, and a plurality of claw portions. One of the plurality of claw portions is the first claw portion 73, which has a plate-like shape and protrudes upward from the upper end portion of the back panel 72. The back portion 52 of the body 53 includes the first plate 61, which has the lower end portion in which the cutout 63 is formed, and the second plate 62, which is disposed forward of the first plate 61 with a predetermined distance between the first plate 61 and the second plate 62. When the first claw portion 73 is inserted into the cutout 63, and the first panel 70 is moved in the direction in which the side panel 71 approaches the side portion 51, the first claw portion 73 is disposed between the first plate 61 and the second plate 62.

Thus, in the outdoor unit 100 of the air-conditioning apparatus according to Embodiment, attaching and detaching the first panel 70 to and from the body 53 are easier than attaching and detaching a panel to and from a body in a related-art outdoor unit.

The invention claimed is:

1. An outdoor unit of an air-conditioning apparatus, the outdoor unit comprising:
    an outer casing having a back portion and a side portion, the outer casing including
        a body in which a first opening is formed to be continuous in the side portion and the back portion, and
        a first panel that covers the first opening and whose cross section has an L shape, wherein
    the first panel includes
        a side panel that covers a part formed in the side portion of the first opening,
        a back panel that covers a part formed in the back portion of the first opening, and
        a plurality of claw portions,
    one of the plurality of claw portions is a first claw portion that has a plate-like shape and that protrudes upward from an upper end portion of the back panel,
    the back portion of the body includes
        a first plate having a lower end portion in which a cutout is formed, and
        a second plate disposed forward of the first plate with a predetermined distance between the first plate and the second plate, and
    when the first claw portion is inserted into the cutout, and the first panel is moved in a direction in which the side panel approaches the side portion, the first claw portion is disposed between the first plate and the second plate.

2. The outdoor unit of an air-conditioning apparatus of claim 1, wherein
    a second opening is formed in the body to be continuous in the side portion and the back portion and such that a lower end of the second opening is continuous with an upper end of the first opening,
    the body includes a second panel that covers the second opening, and the second panel includes the first plate in which the cutout is formed and the second plate.

3. The outdoor unit of an air-conditioning apparatus of claim 1, wherein the first claw portion includes a stepped portion that is brought into contact with an edge of the cutout when the first panel is moved in the direction in which the side panel approaches the side portion.

4. The outdoor unit of an air-conditioning apparatus of claim 1, wherein
the first panel includes a second claw portion disposed at a front of the back panel,
the second claw portion includes
a base protruding forward from the front of the back panel, and
a protrusion protruding from the base away from the side panel,
a third opening into which the second claw portion is inserted is formed in the body, and
when the second claw portion is inserted into the third opening, and the first panel is moved in the direction in which the side panel approaches the side portion, the protrusion of the second claw portion is hooked on an edge of the third opening.

5. The outdoor unit of an air-conditioning apparatus of claim 4, wherein a fourth opening is formed in the first panel to face the third opening.

6. The outdoor unit of an air-conditioning apparatus of claim 1, wherein the side panel of the first panel is fixed to the body with a screw.

7. The outdoor unit of an air-conditioning apparatus of claim 1, further comprising:
a fan;
an outdoor heat exchanger; and
a compressor, wherein
the body is partitioned into a fan compartment in which the fan and the outdoor heat exchanger are disposed and a machine compartment in which the compressor is disposed, and
the first opening is formed in the machine compartment.

8. The outdoor unit of an air-conditioning apparatus of claim 1, wherein the second plate is disposed forward of the first plate in a forward direction that is perpendicular to the direction in which the first claw portion protrudes.

9. The outdoor unit of an air-conditioning apparatus of claim 1, wherein the first claw portion is disposed between the first plate and the second plate in a forward direction that is perpendicular to a direction in which the first claw portion protrudes after the first claw portion has been inserted into the cutout and after the first panel has been moved in the direction in which the side panel approaches the side portion.

* * * * *